(12) United States Patent
Ruf

(10) Patent No.: US 7,852,095 B2
(45) Date of Patent: Dec. 14, 2010

(54) DEVICE AND METHOD FOR ELECTRICAL CONTACTING SEMICONDUCTOR DEVICES FOR TESTING

(75) Inventor: Bernhard Ruf, Sauerlach (DE)

(73) Assignee: Qimonda AG, Munich (DE)

( * ) Notice: Subject to any disclaimer, the term of this patent is extended or adjusted under 35 U.S.C. 154(b) by 359 days.

(21) Appl. No.: 12/050,642

(22) Filed: Mar. 18, 2008

(65) Prior Publication Data

US 2008/0231295 A1    Sep. 25, 2008

(30) Foreign Application Priority Data

Mar. 19, 2007    (DE) .................. 10 2007 013 063

(51) Int. Cl.
*G01R 31/02*    (2006.01)
(52) U.S. Cl. .................. 324/754; 324/762
(58) Field of Classification Search ............. 324/158.1, 324/763, 765, 750–758; 365/148, 100, 163, 365/210.12
See application file for complete search history.

(56) References Cited

U.S. PATENT DOCUMENTS 7,598,021 B2 * 10/2009 Sandhu .................. 430/311
2009/0161460 A1 * 6/2009 Symanczyk et al. ......... 365/201

FOREIGN PATENT DOCUMENTS

EP    1653473 A2    5/2006

* cited by examiner

*Primary Examiner*—Minh N Tang
*Assistant Examiner*—Trung Q Nguyen
(74) *Attorney, Agent, or Firm*—Dicke, Billig & Czaja, PLLC

(57) ABSTRACT

A device and method are disclosed for electrical contacting of semiconductor devices for testing. One embodiment provides for testing semiconductor devices or integrated circuits, including a probe card with contact tips for the electrical contacting of the semiconductor devices. The electrical connection of at least one contact tip to the test system is adapted to be switched via a resistively switching memory cell. A resistively switching memory cell in the form of a nano switch is integrated in the electrical connection of the contact tip.

18 Claims, 3 Drawing Sheets

DEVICE AND METHOD FOR ELECTRICAL CONTACTING SEMICONDUCTOR DEVICES FOR TESTING

CROSS-REFERENCE TO RELATED APPLICATIONS

This Utility Patent Application claims priority to German Patent Application No. DE 10 2007 013 063.7 filed on Mar. 19, 2007, which is incorporated herein by reference.

BACKGROUND

One or more embodiments relate to semiconductor devices and integrated circuits, and to devices for electrical contacting for testing semiconductor devices and integrated circuits.

The term semiconductor devices means in general integrated circuits or chips, respectively, as well as single semiconductors such as, for instance, analog or digital circuits or single semiconductors, as well as semiconductor memory devices such as, for instance, functional memory devices (PLAs, PALs etc.), and table memory devices (ROMs or RAMs, for example, SRAMs or DRAMs).

For the common manufacturing of a plurality of semiconductor devices such as, for instance, integrated circuits, thin discs of monocrystalline silicon are used, which are referred to as wafers in technical language. In the course of the manufacturing process, the wafers are subject to a plurality of coating, exposure, etching, diffusion, and implantation processing, etc. so as to implement the circuits of the devices on the wafer. Subsequently, the devices implemented on the wafer may be separated from each other, for instance, by sawing, scratching, or breaking. After processing is finished, the semiconductor devices are individualized in that the wafer is sawn apart, or scratched and broken, so that the individual semiconductor devices are then available for further processing.

After performing the above-mentioned wafer processing, the devices implemented on the wafer may, for instance, be tested in wafer tests by using appropriate test devices. After the sawing apart or the scratching and breaking, respectively, of the wafer, the chips that are then available individually are molded in a plastics mass, wherein the semiconductor devices obtain specific packages such as, for instance, TSOP or FBGA packages, etc. The devices are equipped with contact faces in the form of contact pads by which the circuits of the semiconductor device can be contacted electrically. During the molding of the chips in the plastics mass, these contact faces or contact pads are connected with external connection pins or contact balls via bonding wires (bonding).

As mentioned above, semiconductor devices are usually subject to comprehensive tests for examining their functions in the course of the manufacturing process in the semi-finished and/or finished state even prior to being molded or incorporated in corresponding semiconductor modules. By using appropriate test systems or test cells, it is also possible to perform test methods on waver level even prior to the individualization of the semiconductor devices so as to be able to examine the operability of the individual semiconductor devices still on the wafer prior to their further processing.

One embodiment serves, for example, to be used in a device for contacting semiconductor devices during the testing of the operability of semiconductor devices with appropriate test systems. In the following, a conventional device for contacting semiconductor devices for test purposes is described.

In order to electrically connect the semiconductor device to be tested in a test station with the test system, a specific contact device, a semiconductor device test card or else probe card is used. At the probe card, needle-shaped connections (contact needles or probes) are provided which contact the electrical connections, connection pins or contact pads, of the semiconductor devices to be tested.

By using the probe card, electrical signals are generated by the test system connected with the probe card at a test station for testing semiconductor devices that are still available on the wafer, and are introduced into the respective contact pads of the semiconductor devices by using the contact needles or contact tips provided at the probe card. The signals output by the semiconductor device at corresponding contact pads in reaction to the input test signals are in turn tapped by the needle-shaped connections or contact tips of the probe card and transferred to the test system, for instance, via a signal line, where an evaluation of the signals may take place.

At the beginning of the process of testing the operability of the semiconductor device, the contact needles or the probe card, respectively, of the test device are usually positioned above the semiconductor device to be tested such that the respectively desired connections or contact needles of the probe card each contact the desired connections or contact pads of the semiconductor device to be tested.

An important precondition for the exact performing of a test method is the reliable contacting of the semiconductor device to be tested with the probe card. To this end, a good electrical connection must be ensured between the contact needles (at the probe card) of the test system and the contact pads of the semiconductor device to be tested.

In the case of high-parallel probe cards, the concept of joint tester channels is frequently used, i.e. that a plurality of chips to be tested or a plurality of contact pads of the chips to be tested are connected with the test system via a tester channel. If only one of the chips tested generates a short circuit on the joint tester channel of the test system, this may also impair the remaining chips tested, even if they do not include any errors. Thus, the effective chips cannot be differentiated from a defective chip, which may result in a yield reduction.

Another problem consists in that high electrical currents are generated by the short circuit generated on the joint tester channel, which are introduced via the contact tips of the corresponding tester channel into the chips connected thereto. Thus, the remaining circuits that are connected to a joint tester channel along with the defective circuit may be damaged. This may also result in a yield reduction and in irreversible damage of the chips tested. There is further the possibility that the contact tip of the needle is damaged by too high a current density, for instance, by melting off the needle tip.

These problems related with the concept of joint tester channels have so far been solved by the involvement of an ohmic resistance with several 100 Ohm in every joint tester channel so as to restrict the currents generated by a short circuit and to thus minimize its effect on the remaining chips that are connected to a joint tester channel along with a defective chip. An aspect of this method consists in that a loss in performance is related with the involvement of the high-ohmic resistance, which impairs the transmission of high-frequency signals, e.g., over 250 MHz. Another aspect of this conventional method consists in that no high-ohmic resistance can be used in the electrical lines for the supply of chip supply voltages that are used for supporting the internal chip voltages since this would result in unacceptable voltage losses in the supply voltage line.

For these and other reasons, there exists a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
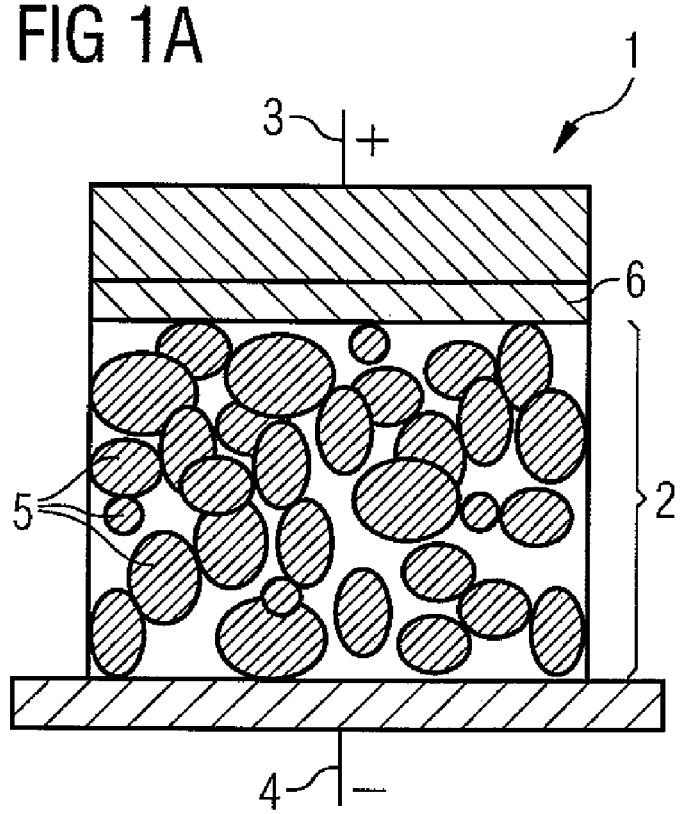
FIG. 1A illustrates a schematic representation of a resistive or resistively switching memory cell in a low-ohmic state.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

For solving the above-mentioned disadvantages, embodiments of the present invention combine a device for electrical contacting for the testing of semiconductor devices with the novel technology of resistive memory devices which is explained in more detail in the following.

As possible alternatives to the previously common semiconductor memories such as, for instance, DRAM, SRAM, or FLASH, so called resistive or resistively switching memory devices, for example, phase change memories (PCM), are known. In phase change memories, a so called "active" or else "switching active" material or a phase change medium, respectively, is arranged between two electrodes (e.g., an anode and a cathode), such as, for instance, a material with a corresponding chalcogenide compound (e.g., a Ge—Sb—Te or Ag—In—Sb—Te compound) that is characterized by a resistive switchability.

Such resistive memory technologies are, for instance, used with PCRAMs (phase change random access memory) or CBRAMs (conductive bridging random access memory). The exact functioning of such technologies will be explained in more detail in the following. With other resistive memory technologies, the physical construction of the memory cell may be different vis-à-vis a CBRAM memory cell or a PCRAM memory cell, wherein, however, the principle of writing, deleting, and reading of the cell content is similar in each case.

In a phase change memory cell (PCRAM), the phase change material may be placed in an amorphous, relatively weakly conductive, or a crystalline, relatively strongly conductive state by using appropriate switching processes. In order to switch, in a resistively switching phase change memory cell, a change from an amorphous state with a relatively weak electrical conductivity in a crystalline state with a relatively good electrical conductivity of the switching-active material, an appropriate current pulse or voltage pulse, respectively, with a programming voltage may be applied to the electrodes, which results in that the switching-active material is heated beyond the crystallization temperature and crystallizes (programming process or write process or "SET process").

Vice versa, a change of state of the switching-active phase change material from a crystalline, i.e. relatively strongly conductive state in an amorphous, i.e. relatively weakly conductive state, may, for instance, be achieved in that, by using an appropriate current pulse or voltage pulse, respectively, with a delete voltage the switching-active material is heated beyond the melting temperature, and is subsequently "quenched" in an amorphous state by quick cooling (delete process or "RESET process").

The functioning of phase change memories is consequently based on the amorphous-crystalline phase transition of a phase change material, wherein the two states of a phase change memory cell, namely the amorphous, high-ohmic state or the crystalline, low-ohmic state, together represent one bit, i.e. a logic "1" or a logic "0". Here, the effect is utilized that the two phases of these compounds distinctly differ in their electrical conductivity, and that the state of the phase change memory cell can thus be recognized again or be read out, respectively. The reading of the memory content may be performed by applying a voltage between the programming voltage and the delete voltage, so that the data content of the memory cell is not changed.

The programming (programming process or write process or "SET process") of a memory cell being in the amorphous, high-ohmic state in the low-ohmic, crystalline phase is performed in that the material of the phase change memory is heated beyond the crystallization temperature by an electrical heating pulse, and is crystallized in so doing. The reverse process, i.e. the delete process or RESET process, is put into practice in that the material is heated beyond the melting point of the phase change material with a stronger heating pulse, i.e. with a higher energy supply than with the writing process, and the amorphous, high-ohmic state in the memory cell is re-established by the delete voltage applied to the memory cell. Subsequently, the memory cell is "quenched" in this amorphous, high-ohmic state by quick cooling.

In CBRAM memory cells, an electrically conductive path may be generated by a positive voltage in an otherwise high-ohmic material, wherein the memory cell assumes a low-ohmic state. The programming process is reversible and can be reversed in a delete process with reverse polarization with a negative voltage, so that it is possible to switch between a low-ohmic and a high-ohmic memory state. The physical processes related therewith occur only from particular threshold voltages on, so that voltages below these threshold values may be used for reading the cell information. These processes for the programming and deleting of a CBRAM memory cell are explained in more detail in FIG. 1 further below.

Embodiments of the present invention eliminate the above-mentioned disadvantages by a device for contacting semiconductor devices for test purposes, including a probe card with a number of contact tips via which electrical contacts of the semiconductor devices are electrically connected with a test system, wherein the electrical connection of at least one contact tip to the test system is adapted to be switched via a resistively switching memory cell.

One aspect consists consequently in the integration of a switch in the form of a resistive or resistively switching memory cell in the electrical connection of a contact tip of the probe card to the test system. The use of a resistively switching memory cell for this purpose entails a plurality of advantages. On the one hand, it is possible to manufacture resistively switching memory cells with extremely small dimensions, and to thus integrate them in almost any position in the electrical connection between the contact tip of the probe card and the test system. On the other hand, resistively switching memory cells may maintain a static state even without a permanent current supply.

The resistively switching memory cell may be designed as a nano switch with very small dimensions. Such a nano switch in the form of a resistively switching memory cell in the electrical connection between the contact tip and the test system enables the switching of the electrical conductivity of the electrical connection, for instance, from a high-ohmic state with a low electrical conductivity to a low-ohmic state with a high electrical conductivity. This is performed by the involvement of a resistively switching memory cell in the electrical connection to the contact tip of the probe card and an appropriate control of the resistively switching memory cell so as to place it in the desired state.

By the appropriate controlling of the resistively switching memory cell, as described above, it may be placed in a high-ohmic state with a plurality of MOhm and a low electrical conductivity, or in a low-ohmic state with only some Ohm and a high electrical conductivity. By involving the resistively switching memory cell in the electrical connection between the contact tip of the probe card and the test system, the electrical connection to the corresponding contact tip of the probe card also obtains, in correspondence with the state of the resistively switching memory cell, a high-ohmic state with a plurality of MOhm with a low electrical conductivity, or a low-ohmic state with only some Ohm and a high electrical conductivity. The resistively switching memory cell may be involved in the electrical connection between the contact tip of the probe card and the test system in serial or parallel connection.

In accordance with one embodiment, a resistively switching memory cell in the form of a nano switch is integrated in this manner in the electrical connection of at least one contact tip of the probe card to the test system. According to one embodiment, a resistively switching memory cell is integrated as a nano switch in at least one contact tip of the probe card itself.

In one embodiment, one aspect of the device consists in that a contact tip at which, for instance, due to a malfunction of a tested chip, a short circuit occurs, may be switched off by using the nano switch without the test signals of the remaining chips that are connected along with the defective chip to a joint tester channel of the test system being impaired by the short circuit at the defective chip. In one embodiment, an aspect of the device consists in that the test signals originating from effective chips may be differentiated from the test signal of the defective chip. In one embodiment, an aspect of the device consists in that, in the case of a short circuit, the corresponding contact tip is adapted to be switched in a high-ohmic state by using the resistively switching memory cell as a nano switch, so that no high electrical currents are generated which might damage the remaining chips that are connected to the corresponding tester channel.

The use of a resistively switching memory cell as a nano switch in the electrical line between a contact tip and the test channel or the test system, respectively, in accordance with the invention can also be implemented in electrical lines or contact tips, respectively, for the supply of chip supply voltages or for supporting the internal chip voltages. A substantial advantage of the use of a resistively switching memory cell as a nano switch in accordance with the invention consists in the extremely small dimensions and the low costs of a resistively switching memory cell vis-à-vis conventional constructions by using relays or other switching elements.

There are different possibilities of implementing a resistively switching memory cell as a nano switch in the electrical line to a contact tip, or of integrating a resistively switching memory cell as a nano switch in a contact tip:

In the form of a resistive memory cell (CBRAM, conductive bridging), or in the form of a programmable metallization memory cell (PMC, programmable metallization cell);

in the form of a phase change memory cell (PCRAM or PRAM);

in the form of a transition metal oxide memory cell; or in the form of a "Solid Electrolyte Nanometer Switch" that is manufactured by the Company NEC (Sakamoto et al., IEDM 2005, 05-489).

All the above-mentioned technologies illustrate a reversible electrical switching behavior between a high-ohmic state with a low electrical conductivity and a low-ohmic state with a high electrical conductivity. The reversibility of this electrical switching behavior enables the arbitrary switching between the states mentioned.

According to one embodiment, the above-mentioned disadvantages are reduced by a method for operating a device for the contacting of semiconductor devices or circuits in which electrical contacts of the semiconductor devices are electrically connected with a test system by using contact tips and resistively switching memory cells connected therewith, the method including:

setting the electrical connection between the test system and the contact tips that are connected with a defective semiconductor device to a high-ohmic state in that the corresponding resistively switching memory cells are placed in a high-ohmic state, and performing one or a plurality of test sequences for determining the operability of the semiconductor devices or circuits contacted via the contact tips (11).

The test sequence can only be performed via such contact needles that are coupled to resistively switching memory cells that are in a low-ohmic state. At the beginning of the method, a setting of the electrical connection between the contact tips and the test system to a low-ohmic state may still be performed in that the resistively switching memory cells that are coupled to the corresponding contact needles are placed in a low-ohmic state. The setting of a low-ohmic state of the resistively switching memory cells by the applying of a voltage pulse may be performed in that a positive threshold voltage is generated in the resistively switching memory cells, so that they are placed in a low-ohmic state.

The setting of a high-ohmic state of the resistively switching memory cells that are connected with a defective semiconductor device or with a defective circuit may be performed by an electrical current caused by the defective semiconductor device or the defective circuit and generating a positive threshold voltage in the corresponding resistively switching memory cells (1), so that they are placed in a high-ohmic state.

FIG. 1A illustrates the schematic structure of a CBRAM memory cell 1 in a highly conductive or low-ohmic state. The CBRAM memory cell 1 includes a layer 2 of a material with resistively switching characteristics such as, for instance, a chalcogenide material manufactured, for instance, of GeSe, GeS, SiSe, SiS, and/or AgSe or Ag—S. In the chalcogenide material there is contained a metallic material with the required solubility an a high mobility within the chalcogenide material, such as, for instance, Cu, Ag, Au, or Zn ions that were diffused into or doped in the chalcogenide material. Thus, the chalcogenide material layer 2 has the property of forming conductive bridges ("conductive bridging"). Hence, the nano structure of the chalcogenide material layer 2 becomes heterogeneous with respect to the chemical composition and the electrical characteristics.

The CBRAM memory cell 1 includes further two electrodes 3 and 4 that are attached to the chalcogenide layer 2 and are in electrical contact therewith. The chalcogenide material layer 2 is in direct contact with both electrodes 3 and 4 while the two electrodes 3 and 4 neither have a direct electrical contact nor an interface with each other, so that the chalcogenide material layer 2 separates the two electrodes 3, 4 from each other. Via the electrodes 3 and 4 it is possible to apply electrical current or voltage pulses to the chalcogenide material layer 2. Furthermore, the electrodes 3, 4 are each connected with metal lines or metal connections (not illustrated) so as to electrically connect the CBRAM memory cell with other devices such as, for instance, transistors or other CBRAM memory cells.

The first electrode 3 that is, like the second electrode 4, in direct contact with the chalcogenide material, may be manufactured of the mobile material, e.g., of Cu, Ag, Au, or Zn so as to serve as an ion donator for the chalcogenide material layer 2. The second electrode 4 may be manufactured of a semiconductive or metallic material which has neither a significant solubility nor a significant mobility in the chalcogenide material, so that the material of the second electrode 4 does not penetrate significantly into the chalcogenide material layer 2 and does not mix therewith. Therefore, the second electrode 4 is manufactured of an inert material such as, for instance, W, Ti, Ta, TiN, Pt, or doped Si, TaN, AL.

The atoms of the metallic material in the chalcogenide material are adapted to form metal-rich accumulations or conglomerates 5. These metal-rich accumulations 5 are cluster-like, amorphous or nanocrystalline aggregations in which the metal-rich material is enriched. The resistive memory switching mechanism of the CBRAM memory cell 1 is substantially based on a variation of the concentration of the metallic material that is incorporated in the chalcogenide material layer 2.

As described above, the electrical resistance of the resistively switching memory cell 1 may vary over several magnitudes from a high resistance (i.e. having an isolating or semiconductive behavior) to low resistance values that are by some magnitudes smaller. This large change in resistance is caused by local variations of the chemical composition of the chalcogenide material layer 2 on a nano-structural basis.

On the basis of a chalcogenide material layer 2 with a variable amount of metallic atoms together with cluster-like amorphous or nanocrystalline aggregations 5, a wide resistance switching behavior of the CBRAM memory cell 1 can be achieved. The modification of the total amount of the accumulations 5 available in the chalcogenide material layer 2 enables a quick modification of the physical and in one embodiment the electrical characteristics of the CBRAM memory cell 1. The resistive switching mechanism is based on the statistical bridge formation of multiple metal-rich accumulations 5 within the chalcogenide material layer 2.

For the programming of the memory cell 1, the top electrode 3 is applied with a positive voltage and the bottom electrode 4, for instance, with a programming voltage with appropriate polarity. In the illustrated embodiment, the top electrode 3 is applied with a positive voltage and the bottom electrode 4 with a negative voltage. Thus, mobile metal ions penetrate into the chalcogenide material layer 2 from the top electrode 3, and electrons from the bottom electrode 4. In order to restrict the diffusion of the mobile metal ions in the chalcogenide material layer 2, a barrier layer 6 may additionally be provided which is positioned between the top electrode 3 and the chalcogenide material layer 2.

Due to the continued application of an electrical write pulse by using the programming voltage on the CBRAM memory cell 1, these accumulations 5 grow in density until they finally touch each other. In so doing, a conductive bridge may form through the entire memory cell 1, which results in a higher electrical conductivity via a metallic connection between the two electrodes 3 and 4 of the memory cell 1. This process serves for the programming of the memory cell 1 and yields a situation with a high conductivity between the electrodes 3 and 4 which thus constitutes the highly conductive or low-ohmic state of the memory cell 1. This state can be maintained for a lengthy storing time, so that the non-volatility of the programming is ensured.

Figure 1B:
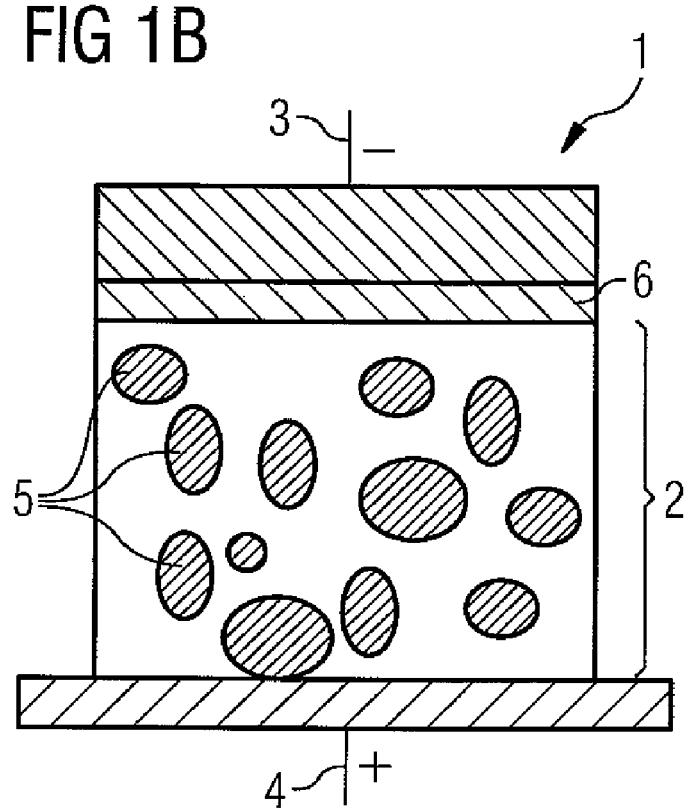
FIG. 1B illustrates a schematic representation of a resistive or resistively switching memory cell in a high-ohmic state.

FIG. 1B illustrates a schematic CBRAM memory cell in a lowly conductive or high-ohmic state. The above-described programming of the memory cell 1 in a highly conductive or low-ohmic state is reversible. To this end, a voltage (delete voltage) inverse to the voltage for the programming process is applied to the electrodes 3, 4 of the memory cell, wherein, in the illustrated embodiment, the top electrode 3 is applied with a negative voltage and the bottom electrode 4 with a positive voltage. Thus, the mobile metal ions are extracted from the chalcogenide material layer 2 via the top electrode 3 that has a negative charge, and the electrons are extracted from the chalcogenide material layer 2 via the bottom electrode 4 that has a positive charge.

The extracting of the mobile metal ions from the chalcogenide material layer 2 causes a reduction in number and size of the metal-rich accumulations 5 in the chalcogenide material. In so doing, the electrical bridging of the chalcogenide material layer 2 is reduced in that the distances between the accumulations 5 widen. This way, the isolated accumulations 5 are not longer in contact with each other and do not form any longer an electrically conductive bridge through the previously highly conductive or low-ohmic chalcogenide material layer 2. This process results in the deleting of the memory cell 1 and produces a situation with lower conductivity between the electrodes 3 and 4 which constitutes the lowly conductive or high-ohmic state of the memory cell 1.

Figure 2A:
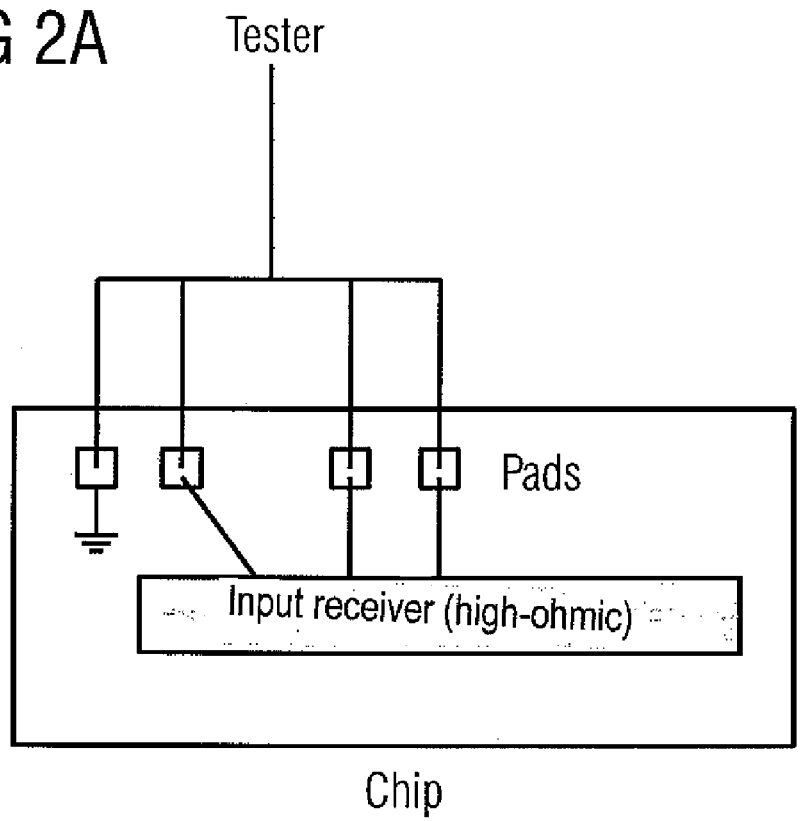
FIG. 2A illustrates a schematic representation of a test system for testing a semiconductor device with a multi-used test channel.

FIG. 2 illustrates a schematic representation of a test system for the testing of semiconductor devices with a multi-used test channel. FIG. 2 illustrates the chip of a semiconductor device as a rectangle. The chip includes a number of contact pads that are illustrated as squares in a row. The majority of the contact pads are connected at the side of the semiconductor device with a high-ohmic input receiver, wherein one contact pad is connected with ground potential. Via a device for electrical contacting such as, for instance, a probe card, the contact pads of the semiconductor device to be tested are connected with a test system or the tester, respectively. The tester illustrated in FIG. 2 is a parallel test system in which the electrical connections between the contact pads and the test system are performed via a joint tester channel.

Since a plurality of contact pads are connected via a common tester channel with the tester, an error signal that occurs at one of the contact pads only may impair the test result of the remaining contact pads even if the circuits of the chip which are connected with these contact pads do not include any errors. Thus, the effective circuits of the chip cannot be differentiated from the defective circuits of the chip, which may result in a reduction of yield.

According to one embodiment, it is now possible to switch off the contacting of individual contact pads in that the resistively switching memory element in the electrical connection of the corresponding contact tip at which the error signal was detected is switched in a non-conductive state. This is, for instance, performed after an error signal has occurred at one of the contact pads connected with the joint tester channel in that the resistively switching memory device in the electrical connection to the contact tip contacting the corresponding contact pad is placed in a high-ohmic state with low electrical conductivity. Thus, no more electrical signal gets from the contact pad at which the error signal was detected to the test system, and the test signals of the remaining contact pads are no longer impaired by the defective signal.

Since the contact pads are connected with the tester via a joint tester channel, it is not always possible to unambiguously assign a defective signal to a particular contact pad. With the device according to one embodiment, it is, however, possible to consecutively interrupt the electrical contacting to every single contact pad, and to thus determine an unambiguous assignment of the defective signal to a particular contact pad.

Figure 2B:
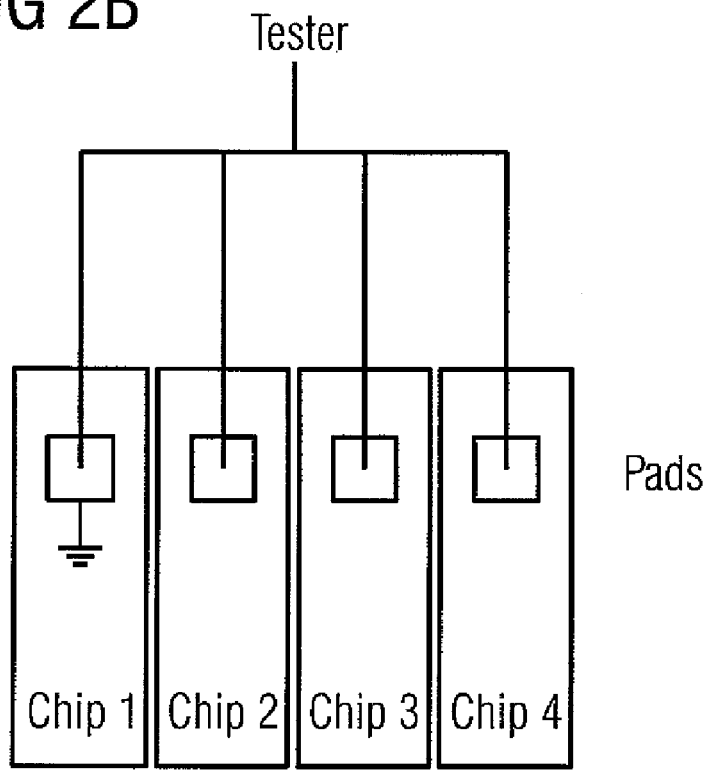
FIG. 2B illustrates a schematic representation of a test system for testing a plurality of semiconductor devices with a multi-used test channel.

FIG. 2B illustrates a schematic representation of a test system for the testing of a plurality of semiconductor device with a multi-used tester channel. One tester channel is distributed to four contact needles which in turn contact four contact pads of respectively separate semiconductor devices. The four contact pads are consequently assigned to four different chips. This arrangement with a jointly used tester channel is also referred to as "shared driver".

In the embodiment illustrated in FIG. 2B, among the four contacted chips, the first chip at the left side has a malfunction while the other three chips are effective. Due to the malfunction of the one chip, an electrical short circuit with high current intensity is caused at the left contact pad, which is indicated by the connection of the corresponding contact pad to ground potential. This short circuit and the high current intensity that thus occurs at the joint tester channel may negatively influence the test result of the other three effective chips, and may damage the corresponding contact needle and/or even the effective chips.

Due to the present invention it is possible that the electrical connection to the contact needle that contacts the defective chip or circuit is interrupted at an early stage. Thus, an impairment of the test results of other chips or circuits as well as their damaging by the electrical short circuit of defective chips or circuits and the high currents related therewith may be prevented.

To this end, the following proceeding may, for instance, be taken. By the following proceeding, the nano switch or the resistively switching memory cell which is coupled with the contact needle contacting the defective chip or circuit can be switched off purposefully.

Applying a short positive voltage pulse. Thus, all four nano switches are initialized in a low-ohmic manner.

Applying a long static negative current pulse. Thus, only the nano switch that is connected with the short-circuited chip is switched off and thus becomes high-ohmic. Since the input receivers of the effective chips which are connected with the contact pads are relatively strongly high-ohmic, no noticeable delete voltage may drop at the resistively switching memory cells (nano switches) that are coupled with the corresponding contact needles contacting the effective chips; these therefore remain low-ohmic.

Now, it is possible, via the contact tips that are coupled with resistively switching memory cells (1) that are in a low-ohmic state, to perform a test sequence at the effective semiconductor devices or circuits while short-circuited chips or circuits remain switched off in the above-described manner. Thus, a negative influence of malfunctioning chips or circuits on the effective chips or circuits and a damage of the contact needles or the probe card are prevented.

Subsequently, a long static write pulse may be applied to the resistively switching memory cells (nano switches) so as to re-establish the initial state. In so doing, high-ohmic resistively switching memory cells (nano switches) are, by the same principle as described under item 2, placed in a low-ohmic state and are thus switched on again. Thus, the initial state of the contact needles or of the probe card is set again, and the device is available again for further test methods.

Figure 3A:
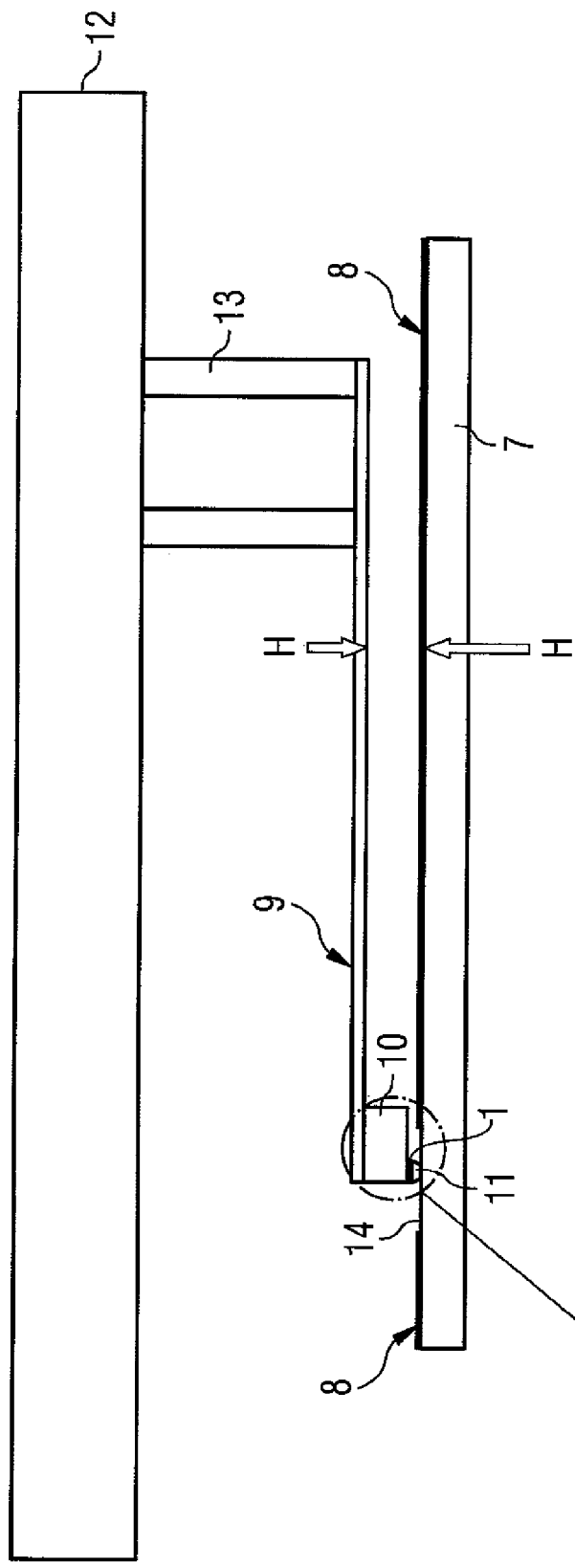
FIG. 3A illustrates a schematic representation of a device according to one embodiment for the electrical contacting of semiconductor devices.

FIG. 3A illustrates a schematic representation of a device according to a preferred embodiment of the present invention for the electrical contacting of semiconductor devices. This side view reveals that a contact holder 9 is arranged via electrically conductive fastenings or electrical lines 13 at the bottom side of a probe card 12. The contact holder 9 has substantially a horizontal orientation parallel to the probe card 12 and includes a free end, at the bottom side of which the basis 10 for a contact tip 11 is arranged. While a probe card 12 as a rule includes a plurality of contact holders 9, only one contact holder 9 with one contact tip 11 is illustrated in the present drawing for a better overview.

In test operation, the probe card 12 is positioned, along with the contact holders 9 that are arranged thereon, above a wafer 7 such that the contact tips 11 get into contact with the contact faces or the contact pads 14 of a semiconductor device to be tested on the wafer 7 and thus establish an electrical connection between the contact pads 14 of the semiconductor device to be tested and the test system (not illustrated). The distance between the contact holder 9 and the surface of the wafer 7 which is indicated by the arrows H in FIG. 3A may lie in the range of 110 µm.

On the wafer 7, a plurality of semiconductor devices may be positioned which are to be subject to a test method consecutively or in parallel. The surface of the semiconductor devices is frequently protected from unintentional contacts by a passivation layer 8. The contact faces or contact pads 14 of the semiconductor devices to be tested on the wafer 7 are not covered by the passivation layer 8 and can thus be contacted by the contact tips 11 of the probe card 12.

Figure 3C:
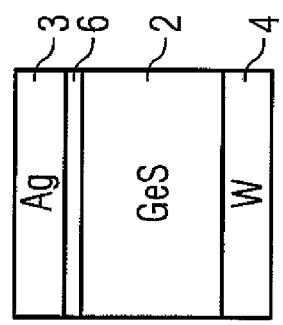
FIG. 3C illustrates a schematic representation of an enlarged section from the section of the device illustrated in FIG. 3A as illustrated in FIG. 3B, according to one embodiment.
Figure 3B:
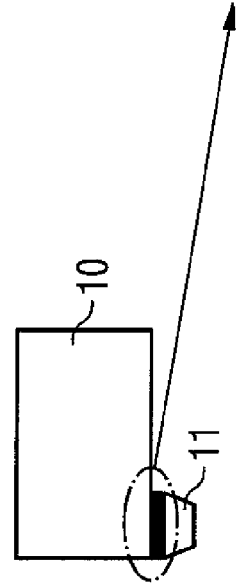
FIG. 3B illustrates a schematic representation of an enlarged section from the device illustrated in FIG. 3A according to one embodiment.

FIG. 3B illustrates a schematic representation of an enlarged section of the region at the free end of the contact holder 9 of the device illustrated in FIG. 3A according to a preferred embodiment of the present invention. In the enlarged section of FIG. 3B it is illustrated that an intermediate layer including a resistively switching memory device is provided between the basis 10 of the contact tip 11 and the contact tip 11.

The resistively switching memory cell is arranged between the basis 10 of the contact tip and the contact tip 11 such that it electrically connects the contact tip 11 with the basis 10. In other words, the resistively switching memory cell is connected with the electrical connection in series between the contact tip 11 and the test system.

FIG. 3C illustrates a schematic representation of an enlarged section from the section illustrated in FIG. 3B of the device according to one embodiment illustrated in FIG. 3A. FIG. 3C illustrates the resistively switching memory device 1 arranged between the basis 10 of the contact tip 11 and the contact tip 11. The structure and the function of the resistively switching memory device 1 illustrated in FIG. 3C corresponds to the layer structure explained by using FIGS. 1A and 1B and to the operating mode thereof.

In the embodiment illustrated in FIG. 3C, the top electrode 3 of the resistively switching memory device 1 is manufactured of silver (Ag), the chalcogenide layer 2 of a germanium silicon material mixture (GeS), and the bottom electrode 4 of tungsten (W). The top electrode 3 of the resistively switching memory device 1 is coupled with the basis 10 while the bottom electrode 4 is coupled with the contact tip 11.

By corresponding controlling of the resistively switching memory cell 1, as described above, it may be placed in a high-ohmic state with low electrical conductivity or in a low-ohmic state with high electrical conductivity. Since the resistively switching memory cell 1 is integrated in the electrical connection between the contact tip 11 of the probe card 12 and the test system, the electrical connection to the corresponding contact tip 11 of the probe card is placed in a conductive state or in a non-conductive state in correspondence with the state of the resistively switching memory cell 1.

This way, the resistively switching memory cell 1 is integrated in the electrical connection of the contact tip 11 to the test system in the form of a nano switch. Thus, it is possible to switch on or switch off the corresponding contact tip 11 and thus the electrical connection to the corresponding contact pad 14 of the semiconductor device to be tested. This means that the signals received by the contact tip 11 at the contact pad 14 of the semiconductor device to be tested are transmitted to the test system in the switched-on state of the nano switch or the resistively switching memory cell 1, and are not transmitted to the test system in the switched-off state of the nano switch or the resistively switching memory cell 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for contacting semiconductor devices or integrated circuits for testing, the device comprising:
    a probe card with a number of contact tips via which electrical contacts of the semiconductor devices or circuits are electrically connected with a test system,
    wherein the electrical connection of at least one contact tip to the test system is adapted to be switched via a resistively switching memory cell; and
    wherein the electrical connection of the contact tip to the test system is adapted to be placed in a low-ohmic state via the resistively switching memory cell in that the resistively switching memory cell is placed in a low-ohmic state by applying a positive threshold voltage, or the electrical connection of the contact tip to the test system is adapted to be placed in a high-ohmic state via the resistively switching memory cell in that the resistively switching memory cell is placed in a high-ohmic state by applying a negative threshold voltage.

2. The device of claim 1, wherein the resistively switching memory cell is integrated in the electrical connection between the contact tip of the probe card and the test system.

3. The device of claim 1, wherein at least one resistively switching memory cell is switched in series with the electrical connection between the contact tip of the probe card and the test system.

4. The device of claim 1, wherein the resistively switching memory cell is integrated in a contact tip itself.

5. The device of claim 1, wherein the resistively switching memory cell is arranged between the probe card and the contact tip.

6. The device of claim 1, wherein the resistively switching memory cell is arranged between a basis of the contact tip and the contact tip.

7. The device of claim 1, wherein the resistively switching memory cell is integrated in a basis of the contact tip.

8. The device of claim 1, wherein the resistively switching memory cell is formed as one of a group comprising a nano switch, a resistive CBRAM memory cell, a programmable metallization memory cell, a phase change memory cell, a transition metal oxide memory cell, and a "Solid Electrolyte Nanometer Switch".

9. A method for operating a device for the contacting of semiconductor devices including a probe card with a number of contact tips via which electrical contacts of the semiconductor devices are electrically connected with a test system wherein the electrical connection of at least one contact tip to the test system is adapted to be switched via a resistively switching memory cell, the method comprising:
    setting the electrical connection between the test system and the contact tips that are connected with a defective semiconductor device or a defective circuit to a high-ohmic state in that the corresponding resistively switching memory cells are placed in a high-ohmic state, and
    performing one or a plurality of test sequences for determining the operability of the semiconductor devices or circuits contacted via the contact tips
    wherein electrical contacts of the semiconductor devices are each connected electrically via contact tips and resistively switching memory cells with a test system.

10. The method of claim 9, comprising performing the test sequence via such contact needles that are coupled with resistively switching memory cells in a low-ohmic state.

11. The method of claim 9, comprising:
    setting the electrical connection between a number of contact tips and the test system to a low-ohmic state in that the resistively switching memory cells are placed in a low-ohmic state at the beginning of the process.

12. The method of claim 9, comprising performing the setting of a low-ohmic state of the resistively switching memory cells by applying a voltage pulse that generates a positive threshold voltage in the resistively switching memory cells, so that they are placed in a low-ohmic state.

13. The method of claim 9, comprising performing the setting of a high-ohmic state of the resistively switching memory cells that are connected with a defective semiconductor device or with a defective circuit by an electrical current that is caused by the defective semiconductor device or the defective circuit and that generates a positive threshold voltage in the corresponding resistively switching memory cells, so that they are placed in a high-ohmic state.

14. The method of claim 9, comprising performing the setting of a high-ohmic state of the resistively switching memory cells that are connected with a defective semiconductor device or with a defective circuit by an electrical short circuit that is caused by a defective semiconductor device or a defective circuit and that generates a positive threshold voltage in the corresponding resistively switching memory cells, so that they are placed in a high-ohmic state.

15. The method of claim 9, comprising performing, after the setting of a high-ohmic state of the resistively switching memory cells that are connected with defective semiconductor devices or defective circuits, a further test sequence for determining the operability of the semiconductor devices that are contacted via resistively switching memory cells that are in a low-ohmic state.

16. The method of claim 9, comprising performing the setting of a high-ohmic state of the resistively switching memory cells by applying a short positive voltage pulse.

17. The method of claim 9, comprising performing the setting of a high-ohmic state of the resistively switching memory cells by applying a static negative current pulse.

18. The method of claim 9, comprising:
applying a short positive voltage pulse to the resistively switching memory cells so as to place the resistively switching memory cells in a low-ohmic state;
applying a longer negative voltage pulse to the resistively switching memory cells that are connected with a defective semiconductor device or a defective circuit so as to place the corresponding resistively switching memory cells in a high-ohmic state;
performing one or a plurality of test sequences for determining the operability of the semiconductor devices or circuits contacted via the contact tips and coupled with resistively switching memory cells that are in a low-ohmic state; and
applying a longer positive voltage pulse to the resistively switching memory cells so as to place the resistively switching memory cells in a low-ohmic state.

* * * * *